(12) United States Patent  (10) Patent No.: US 7,511,546 B2
Koo                          (45) Date of Patent:    Mar. 31, 2009

(54) SYNCHRONOUS MEMORY DEVICE WITH OUTPUT DRIVER CONTROLLLER

(75) Inventor: Cheul Hee Koo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 109 days.

(21) Appl. No.: 11/479,640

(22) Filed: Jun. 30, 2006

(65) Prior Publication Data

US 2007/0002675 A1    Jan. 4, 2007

(30) Foreign Application Priority Data

Jun. 30, 2005  (KR) .................. 10-2005-0058128

(51) Int. Cl.
*H03H 11/06* (2006.01)
(52) U.S. Cl. .................. 327/261; 327/160; 327/291
(58) Field of Classification Search ............... 327/261, 327/291, 276–279, 299, 141, 142, 160, 161
See application file for complete search history.

(56) References Cited

U.S. PATENT DOCUMENTS

| | | | | |
|---|---|---|---|---|
| 5,761,255 A * | 6/1998 | Shi | ............... | 375/360 |
| 5,987,085 A * | 11/1999 | Anderson | ............... | 375/374 |
| 6,181,178 B1 * | 1/2001 | Choi | ............... | 327/175 |
| 6,483,361 B1 * | 11/2002 | Chiu | ............... | 327/159 |
| 6,525,988 B2 * | 2/2003 | Ryu et al. | ............... | 365/233 |
| 6,650,594 B1 * | 11/2003 | Lee et al. | ............... | 365/233 |
| 6,928,007 B2 * | 8/2005 | Jin | ............... | 365/194 |
| 6,937,680 B2 * | 8/2005 | Fong et al. | ............... | 375/357 |
| 7,119,591 B1 * | 10/2006 | Lin | ............... | 327/158 |
| 7,173,878 B2 * | 2/2007 | Kim | ............... | 365/233 |
| 7,336,752 B2 * | 2/2008 | Vlasenko et al. | ............... | 375/376 |
| 2004/0240298 A1 * | 12/2004 | Jin | ............... | 365/222 |

FOREIGN PATENT DOCUMENTS

KR    10-2005-0041612    5/2005

OTHER PUBLICATIONS

'Device Operation & Timing Diagram' DDR SDRAM Data Book, Rev. 1.0 Jul. 2005, pp. 1-44.

* cited by examiner

*Primary Examiner*—Lincoln Donovan
*Assistant Examiner*—Hai L. Nguyen
(74) *Attorney, Agent, or Firm*—Ladas & Parry LLP

(57) ABSTRACT

A synchronous memory device having an output driver controller, comprises a DLL circuit for receiving an external clock and outputting an internal clock; an output driver for outputting data in synchronism with the internal clock; and an output driver controller for controlling operation of the output driver, wherein the output driver controller makes the output driver active after receiving from the DLL circuit a control signal indicating that the internal clock is locked and is in a stabilized state.

6 Claims, 3 Drawing Sheets

SYNCHRONOUS MEMORY DEVICE WITH OUTPUT DRIVER CONTROLLLER

BACKGROUND OF THE INVENTION

1. Field of the Invention

The present invention relates, in general, to an output driver controller, and more particularly to a controller for controlling the data output driver of a synchronous semiconductor memory device.

2. Description of the Related Art

Generally, in a synchronous semiconductor memory device (hereinafter, simply referred to as a "memory device"), data input and output timing is controlled using an internal clock which is synchronized to an external clock. As is well known in the art, a DLL circuit is a circuit that is most widely used to generate an internal clock synchronized to an external clock.

It is normal that a memory device having a DLL circuit uses an internal clock outputted from the DLL circuit to control data input and output timing.

FIG. 1 is a block diagram for explaining data output operations of a conventional memory device having a DLL circuit.

A DLL circuit 100 is a circuit which outputs an internal clock for controlling the internal operation of a memory device using an external clock.

An output driver 110 is a circuit which outputs to the outside the data read from the inside of the memory device.

An output driver controller 120 is a circuit which controls the operation of the output driver 110. The output driver 110 is enabled while the output signal from the output driver controller 120 maintains an enable state, and is disabled while the output signal from the output driver controller 120 maintains a disable state (or a reset state).

However, in the conventional art, a disable signal (that is, a reset signal) is outputted from the output driver controller 120 while the output driver controller 120 is not operated, and if a read command is applied for data reading, in response to the read command, the output driver controller 120 escapes from the disable state and outputs an enable signal.

Therefore, in the conventional art, a problem is caused in that the operational state of the output driver 110 is determined by the output driver controller 120 irrespective of the state of the output signal from the DLL circuit 100, whereby data output timing can be made unclear.

SUMMARY OF THE INVENTION

Accordingly, the present invention has been made in an effort to solve the problems occurring in the related art, and an object of the present invention is to provide an output driver controller which generates a signal for controlling the operation of an output driver after determining whether the internal clock outputted from a DLL circuit is in a stabilized state.

In order to achieve the above object, according to one aspect of the present invention, there is provided a synchronous memory device having an output driver controller, comprising a DLL circuit for receiving an external clock and outputting an internal clock; an output driver for outputting data in synchronism with the internal clock; and an output driver controller for controlling operation of the output driver, wherein the output driver controller makes the output driver active after receiving from the DLL circuit a control signal indicating that the internal clock is locked and is in a stabilized state.

According to another aspect of the present invention, the DLL circuit includes a counter for counting the toggling number of the external clock; and the DLL circuit additionally outputs an enable signal for enabling the output driver controller when the toggling number of the external clock which is counted by the counter exceeds a predetermined number.

According to another aspect of the present invention, the predetermined number is a minimum toggling number for ensuring that the output signal of the DLL circuit is stabilized.

According to another aspect of the present invention, the synchronous memory device further comprises a reset section for controlling the output driver controller.

According to still another aspect of the present invention, the reset section outputs a reset signal for disabling the output driver controller when the synchronous memory device enters a power-down mode or a self-refresh mode or the DLL circuit is reset.

According to yet still another aspect of the present invention, when the reset signal is released, the output driver controller is enabled after receiving from the DLL circuit a control signal indicating that the internal clock is locked and is in a stabilized state.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
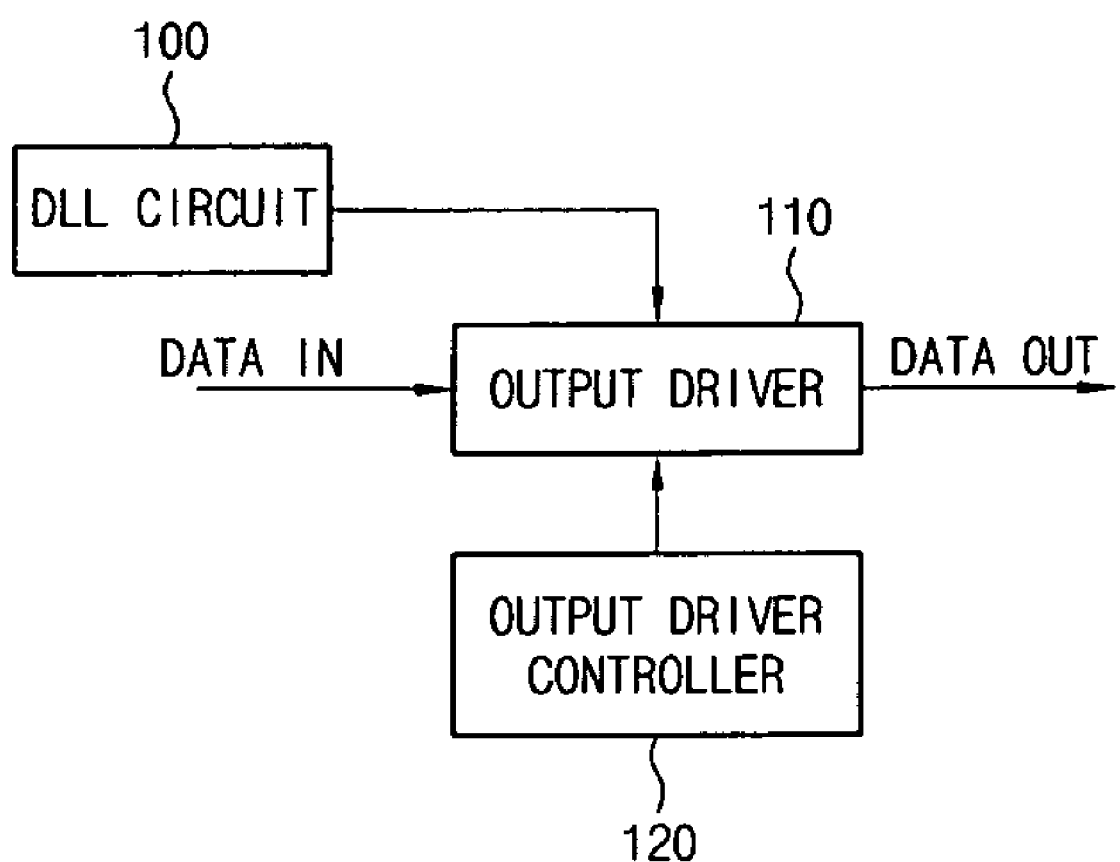
FIG. 1 is a block diagram for explaining data output operations of a conventional memory device which has a DLL circuit.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
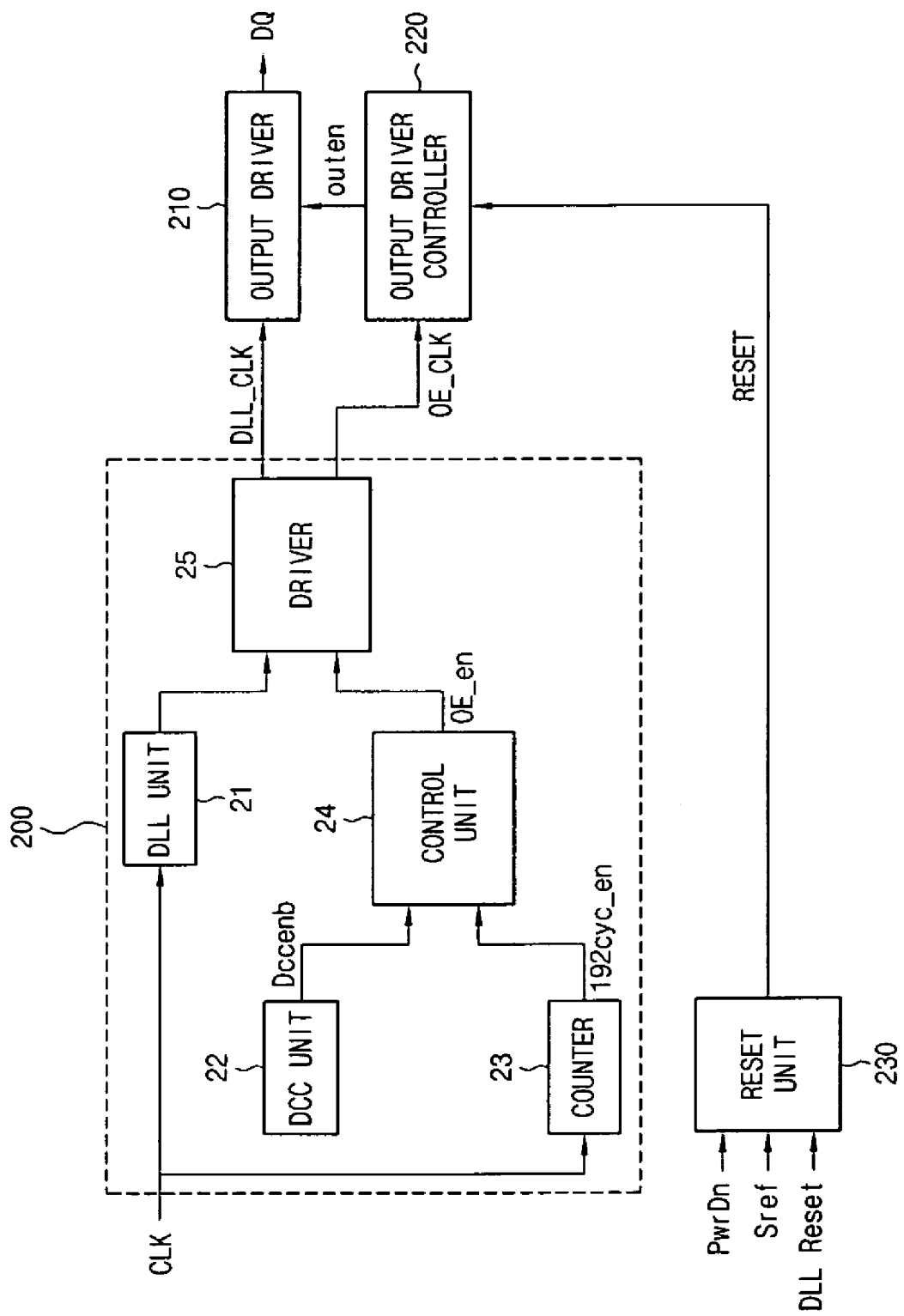
FIG. 2 is a block diagram for explaining data output operations of a memory device in accordance with an embodiment of the present invention.

FIG. 2 is a block diagram for explaining operations of an output driver controller in accordance with an embodiment of the present invention.

In FIG. 2, The DLL circuit 200 comprises a DLL unit 21, a DCC unit 22, a counter 23, a controller 24 and a driver 25.

A DLL unit 21 receives an external clock CLK and generates an internal clock which is to be used in a memory device. While not concretely illustrated, the DLL unit 21 includes a delay part for delaying the external clock CLK by a predetermined time, a phase comparison part for comparing the phases of the output signal of the delay part and the external clock CLK, and a control part for controlling the delay time of the delay part using the comparison result from the phase comparison part. Since various configurations of the DLL unit 21 have been known in the art, the detailed description thereof will be omitted.

The DCC (duty cycle correction) unit 22 adjusts the duty ratio of the signal outputted from the DLL unit 21 to one desired by a user. Usually, the duty of the signal outputted from the DLL unit 21 is adjusted to 50%. However, in addition to this function, the DCC unit 22 of the present invention also outputs a signal Dccenb which indicates that duty ratio adjustment is completed. Here, if the signal Dccenb is enabled, it means that the DLL clock is stabilized.

The counter 23 is a circuit for counting the toggling number of the external clock CLK. In the present invention, if 192 cycles are lapsed after the external clock CLK is applied, the counter 23 outputs an enable signal 192cyc_en. Here, the 192 cycles indicate the time which is required for a stabilized internal clock to be outputted from the DLL circuit 200. The toggling number may vary depending upon the operation frequency of the memory device or the performance of the DLL circuit 200.

The control unit 24 receives the output signal Dccenb from the DCC unit 22 and the output signal 192cyc_en from the counter 23. When one of the two signals Dccenb and 192cyc_en is enabled, the control unit 24 senses this state and outputs a signal OE_en.

The driver 25 finally outputs an internal clock DLL_CLK which is synchronized to the external clock CLK. When the output signal OE_en of the control unit 24 is enabled, the driver 25 is made active. Accordingly, if the output signal OE_en of the control unit 24 is enabled, the driver 25 receives the output signal from the DLL unit 21 and outputs the internal clock DLL_CLK.

An output driver 210 outputs to an external data pin DQ the data which is read out in response to a read command in synchronism with the internal clock DLL_CLK outputted from the DLL circuit 200.

An output driver controller 220 controls the operation of the output driver 210. That is to say, while the signal outen outputted from the output driver controller 220 is maintained in an enabled state, the output driver 210 is maintained in an active state.

A reset unit 230 is a circuit for disabling (or resetting) the output driver controller 220. For example, when the memory device enters a power-down mode PwrDn or a self-refresh mode Sref or the DLL circuit 200 enters a resetting mode DLLReset, it is not necessary to maintain the output driver 210 in the active state. As a consequence, in this case, a reset command Reset is transmitted to the output driver controller 220 to reset the output driver controller 220. The reset output driver controller 220 disables the output driver 210.

Hereafter, the operations of the circuit shown in FIG. 2 will be described.

First, the case in which the output driver 210 is disabled will be explained.

The case in which the output driver 210 is disabled and does not implement data output operation generally corresponds to when the memory device is in the power-down mode PwrDn or the self-refresh mode Sref or the DLL circuit 200 is reset not to operate.

When the memory device is in the power-down mode PwrDn or the self-refresh mode Sref or the DLL circuit 200 is in a reset state, the reset unit 230 senses this state and outputs the reset signal Reset of a high level.

The output driver controller 220 which receives the reset signal Reset of a high level outputs a control signal for disabling the output driver 210.

Thus, the output driver 210 is disabled.

Next, the case in which the output driver 210 is enabled will be explained.

When the memory device escapes from the power-down mode PwrDn or the self-refresh mode Sref or the DLL circuit 200 escapes from the reset state, the reset unit 230 outputs a reset signal Reset of a low level and releases the current reset state. In other words, the reset unit 230 escapes from the current reset state.

In order to ensure that the output driver controller 220 is enabled, at the same time the reset signal Reset of a low level is applied to the output driver controller 220, the control signal OE_CLK from the DLL circuit 200 must be enabled. Therefore, the output driver controller 220 which receives the reset signal Reset of a low level checks whether the control signal OE_CLK is applied thereto from the DLL circuit 200.

As described above, the control signal OE_CLK is a signal which indicates that the internal clock DLL_CLK outputted from the DLL circuit 200 is stabilized. Accordingly, the fact that the control signal OE_CLK is enabled means that the internal clock DLL_CLK outputted from the DLL circuit 200 is locked within a predetermined error range. This also means that the internal clock DLL_CLK of the DLL circuit 200 is stabilized. Whether the internal clock DLL_CLK is stabilized can be determined by counting the toggling number of the external clock CLK or by the output signal Dccenb of the DCC unit 22 in the DLL circuit 200.

As described above, the output driver controller 220 does not output a signal for enabling the output driver 210 before receiving the control signal OE_CLK even after the reset signal Reset is released to the low level. This feature is differentiated from the conventional art in which the output driver is enabled immediately after the reset signal is released.

As described above, the output driver controller 220 enables the output driver 210 after receiving the control signal OE_CLK indicating that the internal clock DLL_CLK is stabilized. Hence, the operation of the output driver 210 which adjusts data output timing in synchronism with the internal clock DLL_CLK can be stabilized.

Figure 3:
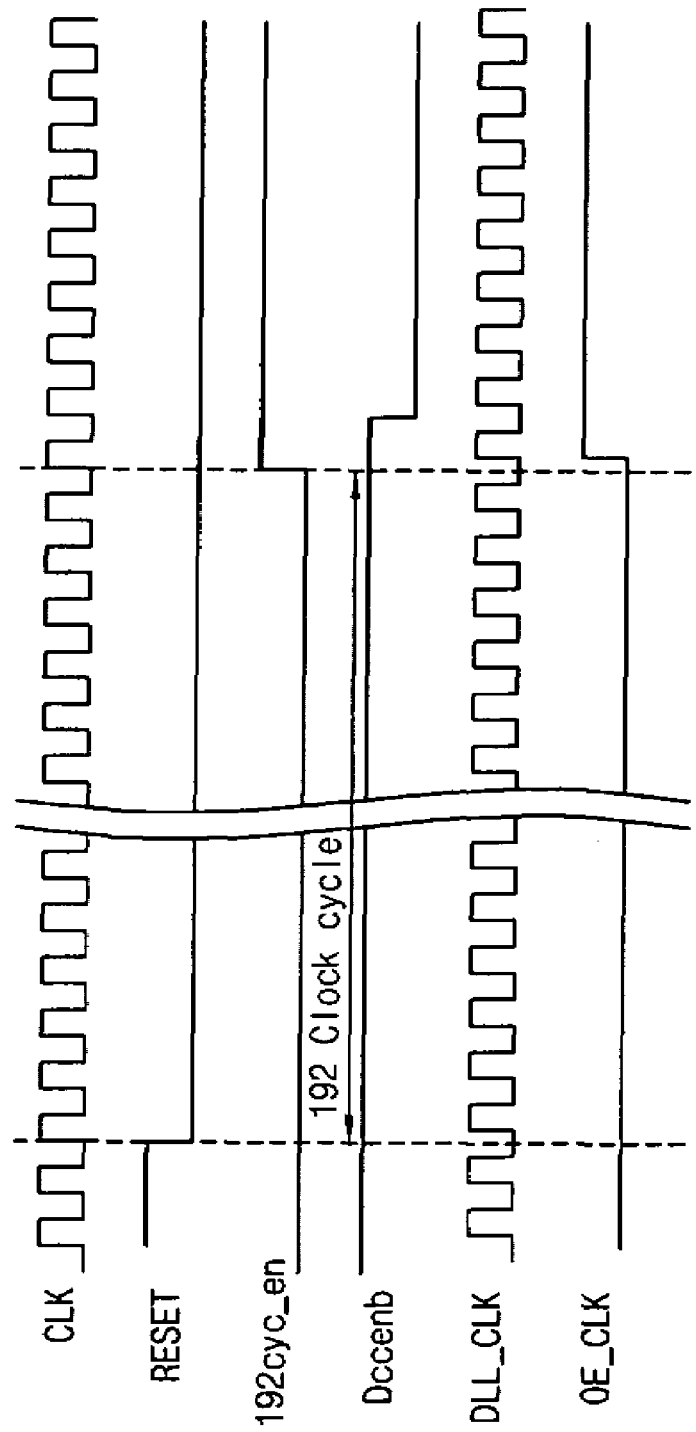
FIG. 3 is a waveform diagram used for explaining the data output operations in FIG. 2.

FIG. 3 is a waveform diagram used for explaining the data output operations in FIG. 2.

As can be readily seen from FIG. 3, in response to an earlier time between the time when a predetermined period is lapsed after the external clock CLK is applied to the DLL circuit (here, the time when 192 cycles are completed) and the time when the output signal Dccenb of the DCC unit is enabled, the control signal OE_CLK is enabled.

As is apparent from the above description, in the present invention, after the internal clock outputted from a DLL circuit is stabilized, an output driver is enabled, as a result of which the stable operation of the output driver can be ensured.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A synchronous memory device having an output driver controller, comprising:
    a DLL circuit for receiving an external clock and outputting an internal clock and a control signal,
        wherein the control signal indicates that the internal clock is locked and in a stable state;
    an output driver for outputting data in synchronism with the internal clock; and
    the output driver controller for controlling operation of the output driver by receiving the control signal,
        wherein the output driver controller makes the output driver active to output the data after receiving from the DLL circuit the control signal.

2. The synchronous memory device as set forth in claim 1, wherein the DLL circuit includes a counter for counting the toggling number of the external clock; and the DLL circuit additionally outputs an enable signal for enabling the output driver controller when the toggling number of the external clock which is counted by the counter exceeds a predetermined number.

3. The synchronous memory device as set forth in claim 2, wherein the predetermined number is a minimum toggling number for ensuring that the output signal of the DLL circuit is stabilized.

4. The synchronous memory device as set forth in claim 1, further comprising:

a reset unit for controlling the output driver controller.

5. The synchronous memory device as set forth in claim 4, wherein the reset unit outputs a reset signal for disabling the output driver controller when the synchronous memory device enters a power-down mode or a self-refresh mode or the DLL circuit is reset.

6. The synchronous memory device as set forth in claim 5, wherein, when the reset signal is released, the output driver controller is enabled after receiving from the DLL circuit the control signal indicating that the internal clock is locked and is in a stabilized state.

* * * * *